United States Patent [19]

Parsons et al.

[11] Patent Number: 4,486,289
[45] Date of Patent: Dec. 4, 1984

[54] PLANAR MAGNETRON SPUTTERING DEVICE

[75] Inventors: Robert R. Parsons; Richard McMahon; Michael L. Thewalt, all of Vancouver, Canada

[73] Assignee: University of British Columbia, Canada, Vancouver, Canada

[21] Appl. No.: 572,037

[22] Filed: Jan. 19, 1984

Related U.S. Application Data

[63] Continuation-in-part of Ser. No. 345,958, Feb. 5, 1982, abandoned.

[51] Int. Cl.³ .............................................. C23C 15/00
[52] U.S. Cl. ................................ 204/298; 204/192 R; 204/192 C
[58] Field of Search ............................ 204/298, 192 R

[56] References Cited

U.S. PATENT DOCUMENTS

| | | | |
|---|---|---|---|
| 4,175,030 | 11/1979 | Love et al. | 204/298 |
| 4,194,962 | 3/1980 | Chambers et al. | 204/298 |
| 4,239,611 | 12/1980 | Morrison, Jr. | 204/298 |
| 4,265,729 | 5/1981 | Morrison, Jr. | 204/298 |

Primary Examiner—Arthur P. Demers
Attorney, Agent, or Firm—Townsend and Townsend

[57] ABSTRACT

A cathode for a planar magnetron sputtering device has a housing which has a side with adjacent inner and outer surfaces, the outer surface being provided with a target mounting surface partially defined by opposed side edges extending along it. The housing also has an elongated cavity partially defined by the side. Clamps are provided to removably retain a target on the target mounting surface. A row of parallel, spaced apart, elongated magnet wafers are disposed in the cavity. The row is substantially equal in length to the length of the target mounting surface. Each pole of each of the magnets is disposed immediately adjacent the inner surface of the side, so that a substantially uniform magnetic field can extend directly from the row to adjacent to, and parallel with, an exposed surface of a target position on the target mounting surface. Additionally, shields which are normally grounded during operation of the cathode, are provided to minimize parasitic sputtering.

22 Claims, 4 Drawing Figures

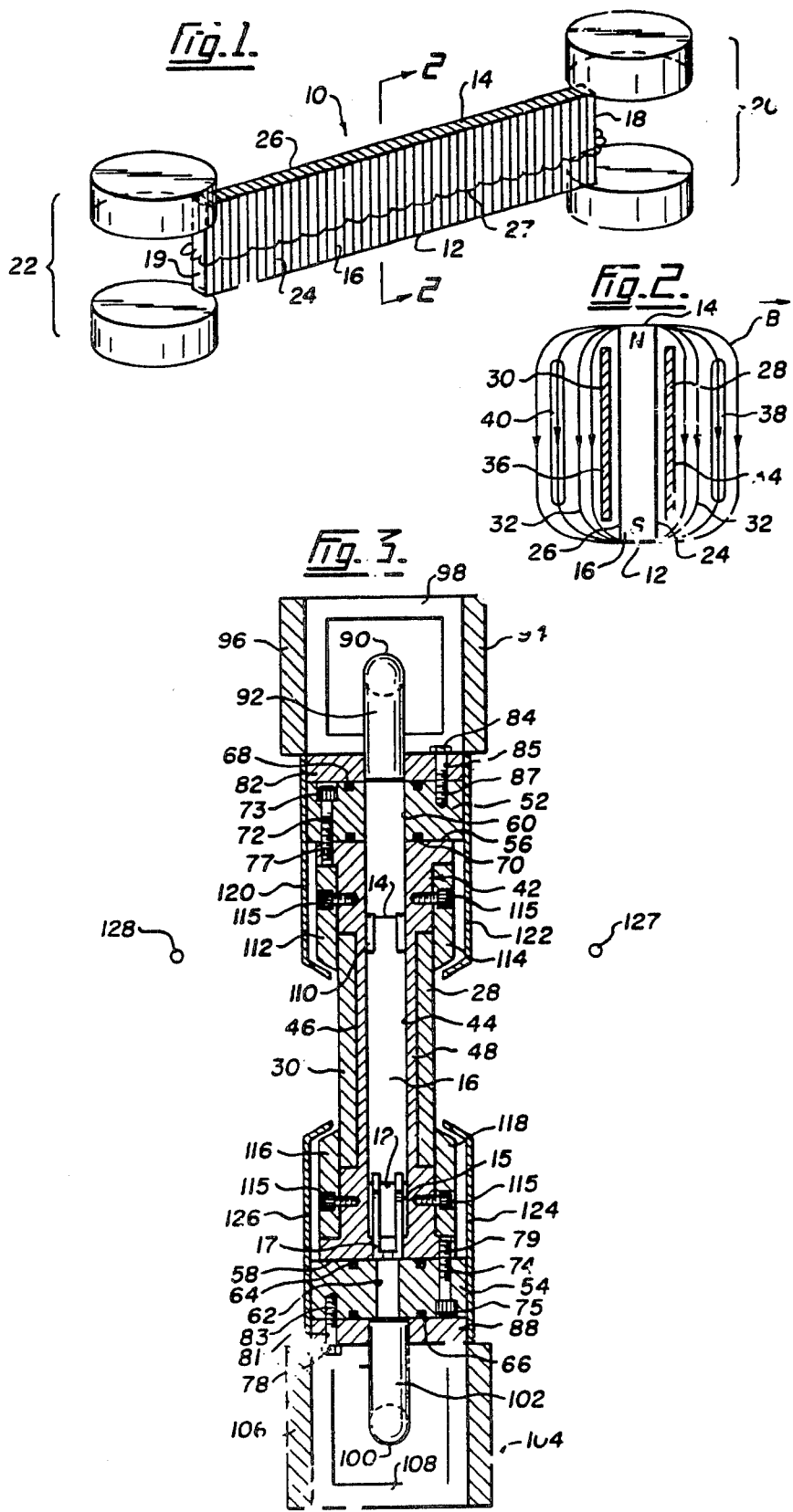

PLANAR MAGNETRON SPUTTERING DEVICE

CROSS REFERENCES TO RELATED APPLICATIONS

This application is a continuation-in-part application to U.S. patent application Ser. No. 345,958 filed Feb. 5, 1982 by Parsons et al, now abandoned.

FIELD OF THE INVENTION

The present invention relates to a magnetron sputtering device for use in coating various substrates with a thin coating of selected target material.

DESCRIPTION OF PRIOR ART

Planar magnetron sputtering utilizing a magnetic field to confine a gaseous discharge was developed to overcome the low efficiency and slow deposition rate of conventional sputtering techniques. Most of the earlier methods exhibited problems of size limitations, poor firm distribution, impurities in the coating due to parasitic sputtering of undesired materials, relatively expensive manufacturing costs of the apparatus, and poor target utilization. Various geometries have been employed in an attempt to overcome the foregoing problems and to optimize efficiency and target utilization. U.S. Pat. No. 4,194,962, Chambers, Mar. 25, 1980 employs a pair of elongated rectangular, spaced apart planar targets with a magnetic field producing apparatus located between the two targets. The magnetic field is produced by a number of spaced apart aligned permanent magnets and directed parallel to the exposed faces and around the ends of the targets by field directing paramagnetic members. The result is the establishment of a belt-like discharge along the exposed surfaces of both targets and around the ends thereof.

A problem with the Chambers device lies in the difficulty in achieving a highly compact unit in order to minimize power and space requirements. The Chambers device depends on the use of paramagnetic material or members to shape and form the magnetic field both along the exposed outer surfaces of the targets and around the ends thereof which magnetic field is produced by a plurality of relatively widely spaced permanent magnets. The permanent magnets themselves must be large enough so that the resultant field when shaped by the paramagnetic material is adequate to contain the discharge.

Second, the use of cooling coils soldered to the back of a target carrier or backing plate requires the latter to be relatively thick in order to allow heat transfer along its thickness to the coils. The thickness of the carrier plate lowers the heat transfer rate to the cooling cols from the targets.

Finally, the employment of the field of the permanent magnets around the ends of the target by means of shaped paramagnetic end plates requires a wider separation between the targets in order to contain the discharge around the ends inasmuch as the magnetic field available at the ends to run the draft path electrons from along one target face to the opposite one is limited by the strength of the permanent magnets.

SUMMARY OF THE INVENTION

A planar magetron sputtering cathode is provided which comprises a magnetically permeable housing. The housing has a side with adjacent inner and outer surfaces. By "adjacent" surfaces, is meant that the side is relatively thin. The outer surface has a target mounting surface partially defined by opposed side edges extending therealong. The housing also has an elongated cavity therein partially defined by the side. Clamp means are provided for removably retaining a target on the target mounting surface in close thermal and electrical contact therewith. In addition, a row of parallel, spaced apart, elongated magnet wafers is provided and which is disposed in the cavity. The row is substantially equal in length to the length of the target mounting surface. Each pole of each of the magnets is positioned immediately adjacent the inner surface of the side. With the foregoing arrangement, a substantially uniform magnetic field can extend directly from the row to adjacent to, and parallel with, an exposed surface of a target positioned on the target mounting surface.

Advantageously, the housing is provided with two opposed sides partially defining the elongated cavity, the outer surfaces of the sides having respective, substantially congruent, target mounting surfaces as described. In this embodiment, each wafer of the row of magnet wafers is arranged such that each pole thereof is immediately adjacent the inner surface of both of the sides, so that a substantially uniform magnetic field extends directly from the row to adjacent to, and parallel with, exposed surfaces of targets positioned on respective target mounting surfaces.

Preferably, the side or sides of the housing are flat, and the magnet wafers are linear and extend in a direction perpendicular to the side edges of the target mounting surface or surfaces. In the embodiment with two sides as described, the sides are parallel.

The thickness of the sides is ideally made sufficiently thin so as to maximize heat transfer and magnetic permeability therethrough, while maintaining structural integrity of the housing.

Advantageously, the cathode additionally comprises fluid inlet and outlet manifolds connected to the housing so as to direct cooling fluid between the magnet wafers and through the cavity in the housing.

The clamp means described, are preferably connected to the outer surface or surfaces of a corresponding or respective sides of the housing, adjacent to both side edges of the target surface or surfaces.

The cathode also usefully additionally comprises a pair of elongated shields, each electricalally isolated from the housing. Each shield extends lengthwise along the outer surface of the side of the housing, and between a corresponding side edge of the target mounting surface and the adjacent side edge of the side. In the embodiment of the cathode with two sides as described, two pair of such shields are provided. In operation of the cathode, the shields are grounded.

The cathode usefully further additionally comprises adjustable auxiliary magnetic field producing means at each end of the row of the magnet wafers. The foregoing means is for establishing a magnetic field of a magnitude and direction such that electrons drifting along a side of the row towards an end thereof, are caused to drift around the end of the row and along the other side of the row.

Preferably, the length of each of the magnetic wafers is at least $\frac{1}{2}$", and the wafers are spaced approximately $\frac{1}{8}$" apart.

DRAWINGS

In drawings which disclose a preferred embodiment of the invention:

FIG. 1 is a schematic perspective view of a row of permanent magnets, sheets of target material and a pair of electromagnets located at either end of the row of permanent magnets, FIG. 2 is a cross sectional view taken along line 2—2 of FIG. 1 which indicate the directions of both the magnetic fields produced by the permanent magnets and a crossed electric field, FIG. 3 is a sectional view of the assembled apparatus using a cathode of the present invention, and FIG. 4 is an exploded view of an end portion of the cathode of FIG. 3.

DESCRIPTION OF THE PREFERRED EMBODIMENTS

Figure 4:
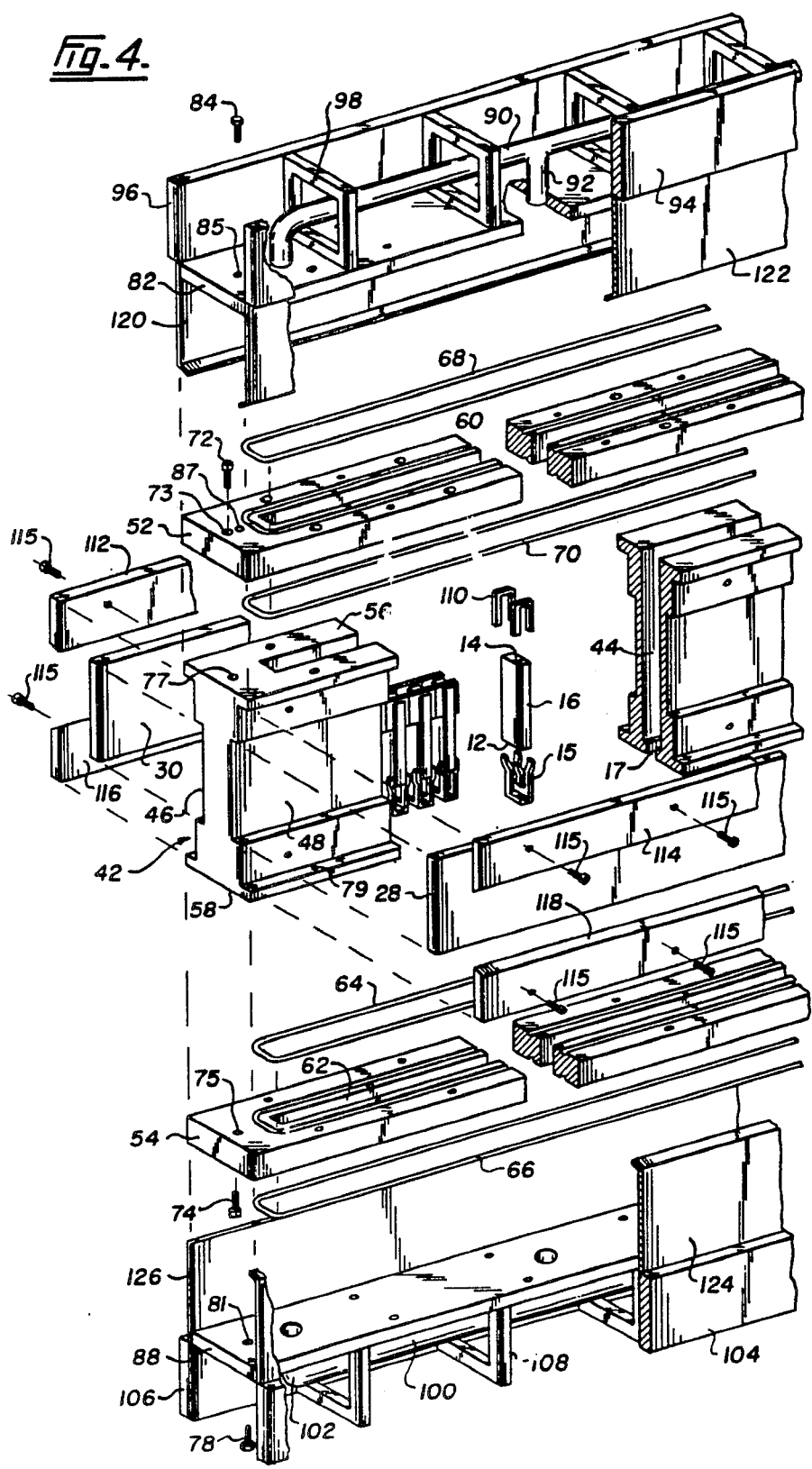

FIG. 1 illustrates in schematic form a row 10 of magnet wafers of permanent magnets 16 having north and south poles aligned along a respective north 14 and south 12 edges. The spacing between the magnets 16 is not shown in this schematic view. Electromagnets 20 and 22 each having a pair of spaced apart poles are located at respective ends 18 and 19 of the row 10.

FIG. 2 taken along line 2—2 of FIG. 2 shows, in addition, a pair of sheets of target material 28 and 30 located adjacent sides 24 and 26 of the row 10. The magnetic field produced by the row of permanent magnets as indicated by lines 32 emerges from the north edge 14 approximately transverse to the sides 24 and 26 of the row 10 and then sharply merges into a direction parallel to the latter sides creating a highly uniform field adjacent the exposed surfaces of the targets 28 and 30 of the order of 200 to 300 gauss. As a result of the establishment of an electric field in the latter space directed normally to the exposed face of the latter-mentioned targets there is established a crossed electromagnetic field which produces a path of travel 27 of individual electrons released from the exposed surface of each target which is semicircular drifting in a direction longitudinally of the row 10 toward an end 19 thereof in consecutive semicircular path segments. Ionization of a selected gas contained within a vacuum enclosure (not shown) results in a discharge adjacent either sides of the respective exposed surfaces 34 and 36 of targets 28 and 30, respectively. The discharge is depicted in FIG. 2 by regions 38 and 40, respectively.

The assembled device illustrated in FIGS. 3 and 4 includes an aluminum housing 42 having an elongated slot 44 formed therein extending from an input surface 56 to an output surface 58. The slot communicates with the output face 58 through a slightly narrower slot 17.

Formed on the outer surfaces of either side of the housing 42 are elongated opposed recessed target mounting surfaces 46 and 48. The row of individual permanent magnet wafers 16 are adapted to be inserted within the slot 44. Each wafer is held at the bottom by a clip 15 which rests on a teflon plate 54. The clip is dimensioned to space the bottom of the wafers apart from adjacent wafers by a gap of approximately ⅛th of an inch. In addition the clips are designed to permit fluid flow therethrough by providing a hole through the bottom thereof and spaced apart prongs for engaging the wafer. The tops of the wafers 16 are spaced apart from adjacent wafers by a pair of spaced apart clips 110 which also permit fluid flow between the wafers. The thickness of the side members of the clip 110 is such that a similar gap of ⅛th of an inch is also provided at the top 14 of the row of wafers 16. As shown most clearly in FIG. 3, each pole of each of the magnet wafers 16 abuts an inner surface of both of the sides of the housing.

A pair of elongated plates 52 and 54, made of a material such as that sold under the trade mark TEFLON, having respective slots 60 and 62 are adapted to be mounted on the input surface 56 and the output surface 58 of the housing. O-rings 70 and 64 which fit within corresponding O-ring grooves in the plates 52 and 54, respectively, seal the plates to the input and output surfaces, respectively when screws 72 and 74 which pass through recessed holes 73 and 75, respectively, in the plates 52 and 54, respectively, threadedly engage corresponding holes 77 and 79 in the input and output surfaces 56 and 58, respectively, of the housing 42. The slot 62 is dimensioned slightly smaller than the slot 17 contained in the bottom of the housing so as to provide a mounting shoulder for clips 15 when the device is assembled.

A copper plate 82 is adapted to be fastened to the top of plate 52 by means of a plurality of screws 84 passing through corresponding screw holes 85 and threadedly engaged in threaded holes 87 in the teflon plate 52. O-rings 68 and 70 fitted in corresponding O-ring grooves on the top and bottom of plate 52 seal the plate 52 to the bottom surface of copper plate 82 and the top output surface 56 of housing 42, respectively. A manifold tube 90 and a plurality of spaced apart feeder tubes 92 passing through holes in the copper plate 82 are soldered to the latter. A plurality of spaced apart rectangular briding pieces 98 having openings therethrough which permit the passage of the manifold tube 90 are also soldered to the copper plate 82 and provide mounting surfaces for a pair of spaced apart elongated aluminum plates 94 and 96 extending along either edge of the plate 82.

A completely equivalent structure consisting of lower TEFLON plates 54, copper plate 88 bridging members 108, manifold 100, feeder tubes 102, spaced apart elongated aluminum plates 104 and 106 are assembled to the output surface 58 of the housing 42. Copper plate 88 is adapted to be fastened to the bottom of teflon plate 54 by means of a plurality of screws 78 passing through corresponding screw holes 81 and registering with threaded holes 83 in the teflon plate 54. The teflon plate 54 is sealed by O-rings 64 and 66 insertable in corresponding O-ring grooves in input and output surfaces of the teflon plate 54 to the output surface 58 of housing 42 and copper plate 88, respectively. A pair of sheets of elongated target material 28 and 30 are adapted to be mounted against corresponding target mounting surfaces 48 and 46, respectively, within associated recesses on either side of the housing 42. Elongated clamps 112, 114, 116 and 118 having slanted edges are connectable to the aluminum housing above and below the target mounting surfaces 46 and 48, respectively, by means of screws 115. Shields 120, 122, 124 and 126 soldered to the edges of the copper plates 82 and 88 extend over the clamps 112, 114, 118, and 116, respectively, and terminate in an inwardly bent edge adjacent the slanted edge of the clamps.

In operation the cathode including the electromagnets 20 and 22 is placed inside an enclosure together with substrates which are to be coated. The shields 120, 122, 124, and 126 are grounded. A pair of water cooled anode tubes 127 and 128 are located approximately 6"

away from the respective target mounting surfaces 48 and 46, respectively. The substrates are placed facing respective exposed surfaces of the sheets of target material 28 and 30, respectively, with the latter being mounted in place on respective target mounting surfaces 48 and 36, respectively. The substrates may be a row of film mounted on a system which continuously winds the film past respective exposed surfaces of the sheets of target material 28 and 30. A pair of cooling lines (not shown) passing through a flange (also not shown) sealingly connectable to the vacuum enclosure are coupled to the manifolds 90 and 100, respectively. The vacuum enclosure is then evacuated to a pressure in the region of $10^{-5}$ to $10-6$ torr in order to degas the system. Once the system has been degassed anode voltage is applied to the anodes 127 amd 128 with respect to the aluminum housing 42. At the same time the flow of cooling oil is directed into the manifold 90 and begins to pass down through the feeder pipes 92 through the cavity 44 in the housing 42 and between the gaps of the permanent magnet wafers 16, out through feeder pipes 102 and return manifold 100.

A suitable gas such as argon is then leaked into the system and directed proximate the sheets of target material 28 and 30. At a pressure in the region of $10^{-3}$ torr a discharge develops adjacent the exposed surfaces of the sheets of target material 28 and 30. The field of the electromagnets 20 and 22 is adjusted to optimize the discharge which develops around the ends of the row of electromagnets 18 and 19, respectively. In operation a continuous belt of gaseous discharge or plasma is developed completely around the device. The grounded shields 120, 122, 124 and 126 assist in preventing positive ions from impinging on the clamps 112, 114, 118, and 116 and thereby prevent parasitic sputtering of the latter. The direction of the magnetic field lines B (see FIG. 2) in the region of the clamps being almost perpendicular to the latter also assists in preventing a discharge from developing in that region as a discharge will tend to develop in the region of the field which is parallel to the exposed sheets of target material 28 and 30.

Obviously there is no limit to the length of the row of permanent magnets 10 which may be utilized and, hence, the length of sheets of target material which may be employed.

It is also obvious that any other means of producing auxiliary magnetic fields across the ends of the device would work provided the strength of the field is adequate to cause the electron paths around the ends of the device to have a sufficiently short radius of curvature so that the discharge would be contained and optimized in these regions.

Other modifications, departures and variations not departing from the spirit of the invention nor the scope as defined in the appended claims will be obvious to those skilled in the art.

We claim:

1. A planar magnetron sputtering cathode comprising:
   (a) a magnetically permeable housing having:
      (i) a side with adjacent inner and outer surfaces, the outer surface having a target mounting surface partially defined by opposite side edges extending therealong; and
      (ii) an elongated cavity therein partially defined by the side;
   (b) clamp means for removably retaining a target on the target mounting surface is close thermal and electrical contact therewith;
   (c) a row of parallel, spaced apart, elongated magnet wafers disposed in the cavity, the row being substantially equal in length to the length of the target mounting surface, each pole of each of the magnets being immediately adjacent the inner surface of the side, so that a substantially uniform magnetic field can extend directly from the row to adjacent to, and parallel with, an exposed surface of a target positioned on the target mounting surface.

2. A planar magetron sputtering cathode comprising:
   (a) a magnetically permeable housing having:
      (i) two opposed sides, each with adjacent inner and outer surfaces, the outer surfaces having respective, substantially congruent, target mounting surfaces, each partially defined by opposed side edges extending therealong;
      (ii) an elongated cavity partially defined by the sides;
   (b) clamp means for retaining each of two targets on respective target mounting surfaces in close thermal and electrical contact therewith;
   (c) a row of parallel, spaced apart elongated magnet wafers disposed in the cavity, the row being substantially equal in length to the length of the target mounting surfaces, each pole of each of the magnets being immediately adjacent the inner surface of both of the sides, so that a substantially uniform magnetic field can extend directly from the row to adjacent to, and parallel with, exposed surfaces of targets positioned on respective target mounting surfaces.

3. A planar magnetron sputtering cathode as described in claim 1 wherein the side is flat and said magnet wafers are linear and extend in a direction perpendicular to the side edges of the target mounting surface.

4. A planar magnetron sputtering cathode as described in claim 2 wherein the sides are flat and parallel, and said magnet wafers are linear and extend in a direction perpendicular to the side edges of the target mounting surfaces.

5. A planar magnetron sputtering cathode as described in claim 1 wherein the side of said housing is sufficiently thin so as to maximize heat transfer and magnetic permeability therethrough, while maintaining structural integrity of said housing.

6. A planar magnetron sputtering cathode as described in claim 4 wherein the side of said housing is sufficiently thin so as to maximize heat transfer and magnetic permeability therethrough, while maintaining structural integrity of said housing.

7. A planar magnetron sputtering cathode as described in claim 4 wherein the sides of said housing are sufficiently thin so as to maximize heat transfer and magnetic permeability therethrough, while maintaining structural integrity of said housing.

8. A planar magnetron sputtering cathode as described in claim 3 additionally comprising fluid inlet and outlet manifolds connected to said housing so as to direct cooling fluid between said magnet wafers and through the cavity in said housing.

9. A planar magnetron sputtering cathode as described in claim 7 additionally comprising fluid inlet and outlet manifolds connected to said housing so as to direct cooing fluid between said magnet wafers and through the cavity in said housing.

10. A planar magnetron sputtering cathode as described in claim 3 wherein said clamp means are connected to the outer surface of the said housing adjacent to both side edges of the target surface.

11. A planar magnetron sputtering cathode as described in claim 9 wherein said clamp means are connected to the outer surfaces of respective sides of said housing adjacent to both side edges of the target surfaces.

12. A planar magnetron sputtering cathode as described in claim 1 additionally comprising a pair of electrically conducting elongated shields each electrically isolated from said housing and extending lengthwise along the outer surface of the side thereof, and between a corresponding side edge of the target mounting surface and the adjacent side edge of the side.

13. A planar magnetron sputtering cathode as described in claim 2 additionally comprising two pair of electrically conducting elongated shields, each shield being electrically isolated from said housing and extending lengthwise along the outer surface of a side thereof, over corresponding clamp means, and between a corresponding side edge of a target mounting surface and the adjacent side edge of the side.

14. A planar magnetron sputtering cathode as described in claim 3 additionally comprising two pair of electrically conducting elongated shields, each shield being electrically isolated from said housing and extending lengthwise along the outer surface of a side thereof, over corresponding clamp means, and between a corresponding side edge of a target mounting surface and the adjacent side edge of the side.

15. A planar magnetron sputtering cathode as described in claim 4 additionally comprising two pair of electrically conducting elongated shields, each shield being electrically isolated from said housing and extending lengthwise along the outer surface of a side thereof, over corresponding clamp means, and between a corresponding side edge of a target mounting surface and the adjacent side edge of the side.

16. A planar magnetron sputtering cathode as described in claim 7 additionally comprising two pair of electrically conducting elongated shields, each shield being electrically isolated from said housing and extending lengthwise along the outer surface of a side thereof, over corresponding clamp means, and between a corresponding side edge of a target mounting surface and the adjacent side edge of the side.

17. A planar magnetron sputtering cathode as described in claim 10 additionally comprising two pair of electrically conducting elongated shields, each shield being electrically isolated from said housing and extending lengthwise along the outer surface of a side thereof, over corresponding clamp means, and between a corresponding side edge of a target mounting surface and the adjacent side edge of the side.

18. A planar magnetron sputtering cathode as described in claim 11 additionally comprising two pair of electrically conducting elongated shields, each shield being electrically isolated from said housing and extending lengthwise along the outer surface of a side thereof, over corresponding clamp means, and between a corresponding side edge of a target mounting surface and the adjacent side edge of the side.

19. A planar magnetron sputtering cathode as described in claim 4, additionally comprising adjustable auxiliary magnetic field producing means at each end of the row of said magnet wafers, for establishing a magnetic field of a magnitude and direction such that electrons drifting along a side of the row towards an end thereof, are caused to drift around the end of the row and along the other side thereof.

20. A planar magnetron sputtering cathode as described in claim 7, additionally comprising adjustable auxiliary magnetic field producing means at each end of the row of said magnet wafers, for establishing a magnetic field of a magnitude and direction such that electrons drifting along a side of the row towards an end thereof, are caused to drift around the end of the row and along the other side thereof.

21. A planar magnetron sputtering cathode as described in claim 15, additionally comprising adjustable auxiliary magnetic field producing means at each end of the row of said magnet wafers, for establishing a magnetic field of a magnitude and direction such that electrons drifting along a side of the row towards an end thereof, are caused to drift around the end of the row and along the other side thereof.

22. A planar magnetron sputterng cathode as described in claim 16, additionally comprising adjustable auxiliary magnetic field producing means at each end of the row of said magnet wafers, for establishing a magnetic field of a magnitude and direction such that electrons drifting along a side of the row towards an end thereof, are caused to drift around the end of the row and along the other side thereof.

* * * * *